(12) United States Patent
Nagata et al.

(10) Patent No.: US 7,135,706 B2
(45) Date of Patent: Nov. 14, 2006

(54) IMAGE SENSOR AND METHOD OF MANUFACTURING THE SAME

(75) Inventors: Hisashi Nagata, Nara (JP); Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/003,343

(22) Filed: Dec. 6, 2004

(65) Prior Publication Data

US 2005/0092992 A1 May 5, 2005

Related U.S. Application Data

(62) Division of application No. 10/458,282, filed on Jun. 11, 2003, now Pat. No. 6,858,868, which is a division of application No. 09/796,676, filed on Mar. 2, 2001, now Pat. No. 6,642,541.

(30) Foreign Application Priority Data

Mar. 7, 2000 (JP) ............................... 2000-62542

(51) Int. Cl.
*H01L 29/04* (2006.01)
(52) U.S. Cl. .................. 257/59; 257/72; 257/258; 257/291; 257/444
(58) Field of Classification Search .................. 257/59, 257/72, 258, 291, 444
See application file for complete search history.

(56) References Cited

U.S. PATENT DOCUMENTS

| | | |
|---|---|---|
| 6,011,274 A | 1/2000 | Gu et al. |
| 6,121,660 A | 9/2000 | Yamazaki et al. |
| 6,124,606 A | 9/2000 | den Boer et al. |
| 6,642,541 B1 | 11/2003 | Nagata et al. |
| 6,784,949 B1 | 8/2004 | Nagata et al. |

FOREIGN PATENT DOCUMENTS

| | | |
|---|---|---|
| JP | 62-162357 | 7/1987 |
| JP | 4-212458 | 8/1992 |
| JP | 9-511361 | 11/1997 |
| JP | 2000-065941 | 3/2000 |

OTHER PUBLICATIONS

U.S. Appl. No. 10/458,282, filed Jun. 11, 2003.
M. Ikeda et al.: "Real-time Imaging Flat Panel X-Ray Detector", AM-LCD '99, pp. 45-58.
D. Waechter et al.: "Characteristics of dual-gate thin-film transistors for applications in digital radiology" Can.I.Phys. (Suppl.) 74: S131-S134 (NRC '96).

(Continued)

*Primary Examiner*—Thien F. Tran
(74) *Attorney, Agent, or Firm*—Nixon & Vanderhye P.C.

(57) ABSTRACT

On a transparent electrically insulating substrate, formed are a scanning line, and a gate electrode of a switching element, further formed are a gate insulating film, a semiconductor layer, an $n^+$-Si layer to be formed into a source electrode and a drain electrode. After the patterning of the foregoing structure, the dielectric film is formed, and the portion corresponding to the contact hole is removed by etching, and photosensitive resin is applied to form the interlayer insulating film. Then, the transparent electrode is extended from the pixel electrode over the switching element, whereon a conversion layer and a gold layer for use in electrode are vapor-deposited. In this structure, an increase in capacitor between the pixel electrode and the signal line can be suppressed by the interlayer insulating film, and the transparent electrode functions as a top gate and release excessive electric charge. As a result, excessive electric charge can be released effectively in the double gate structure while suppressing an increase in capacitor between the pixel electrode and the signal line.

7 Claims, 9 Drawing Sheets

OTHER PUBLICATIONS

W. Den Boer et al.: "Similarities between TFT Arrays for Direct-Conversion X-Ray Sensors and High-Aperture AMLCDs" SID 98 DIGEST pp. 371-374.

Japanese Office Action in counterpart Japanese application dated Jan. 27, 2004, and English language translation thereof.

den Boer et al.; "*25.1: Similarities between TFT Arrays for Direct-Conversion X-Ray Sensors and High-Aperture AMLCDs*"; SID 98 DIGEST; 1998; pp. 371-374.

Original and English translation of Korean Patent Office action dated Mar. 30, 2004.

Original and English translation of Japanese Office Action dated Apr. 20, 2004.

IMAGE SENSOR AND METHOD OF MANUFACTURING THE SAME

This application is a Divisional of application Ser. No. 10/458,282 filed Jun. 11, 2003 now U.S. Pat. No. 6,858,868, which is a Divisional of application Ser. No. 09/796,676 filed Mar. 2, 2001, (now U.S. Pat. No. 6,642,541) the entire contents of which are hereby incorporated herein by reference in this application.

FIELD OF THE INVENTION

The present invention generally relates to an image sensor for converting an incident electromagnetic wave such as a light beam or an X-ray into electric charge and outputting an image signal by sequentially reading out the electric charge, and also relates to a method of manufacturing such image sensor.

BACKGROUND OF THE INVENTION

A known active matrix substrate for use in a liquid crystal display device, etc., includes a plurality of independently driven pixel electrodes arranged in a matrix form, and switching elements such as TFTs (Thin Film Transistors), etc., provided for respective pixel electrodes. In the liquid crystal display device adopting such active matrix substrate, an image is displayed by sequentially selecting the switching elements by scanning lines and reading potentials of signal lines into the pixel electrodes via the switching elements.

The foregoing active matrix substrate can be used for an image sensor. Examples of known image sensors adopting the active matrix substrate include: an image sensor including a conversion layer formed on an upper layer of the active matrix substrate, for directly converting incident electromagnetic wave such as a light beam, an X-ray, etc., into electric charge, wherein the electric charge generated from the conversion layer is stored in pixel capacitance at high voltage, and the electric charge is read out sequentially from the pixel capacitance. For example, Japanese Unexamined Patent Publication No. 212458/1992 (Tokukaihei 4-212458) published on Aug. 4, 1992, discloses an image sensor of the above type wherein electric charge as generated by the conversion layer is stored in auxiliary capacitance, and data (potential data) are stored in respective pixels in the form of electric charge according to the characteristics of an object. As in the case of the aforementioned liquid crystal display device, by sequentially scanning the scanning lines, for example, the data stored in a pixel selected by a scanning line is read out and transmitted via a switching element to a signal line, and an image projected to the image sensor is read out from a circuit such as an operation amplifier provided on the other end of the signal line.

The active matrix substrate, which is a precursor to the sensor in the foregoing example can be manufactured at low costs without requiring any additional facilities, because the manufacturing process for liquid crystal display devices can be used for the manufacturing process of image sensors only by adjusting the dimensions of the pixel capacitance and the time constants of the switching elements to be optimal for image sensors.

Figure 6:
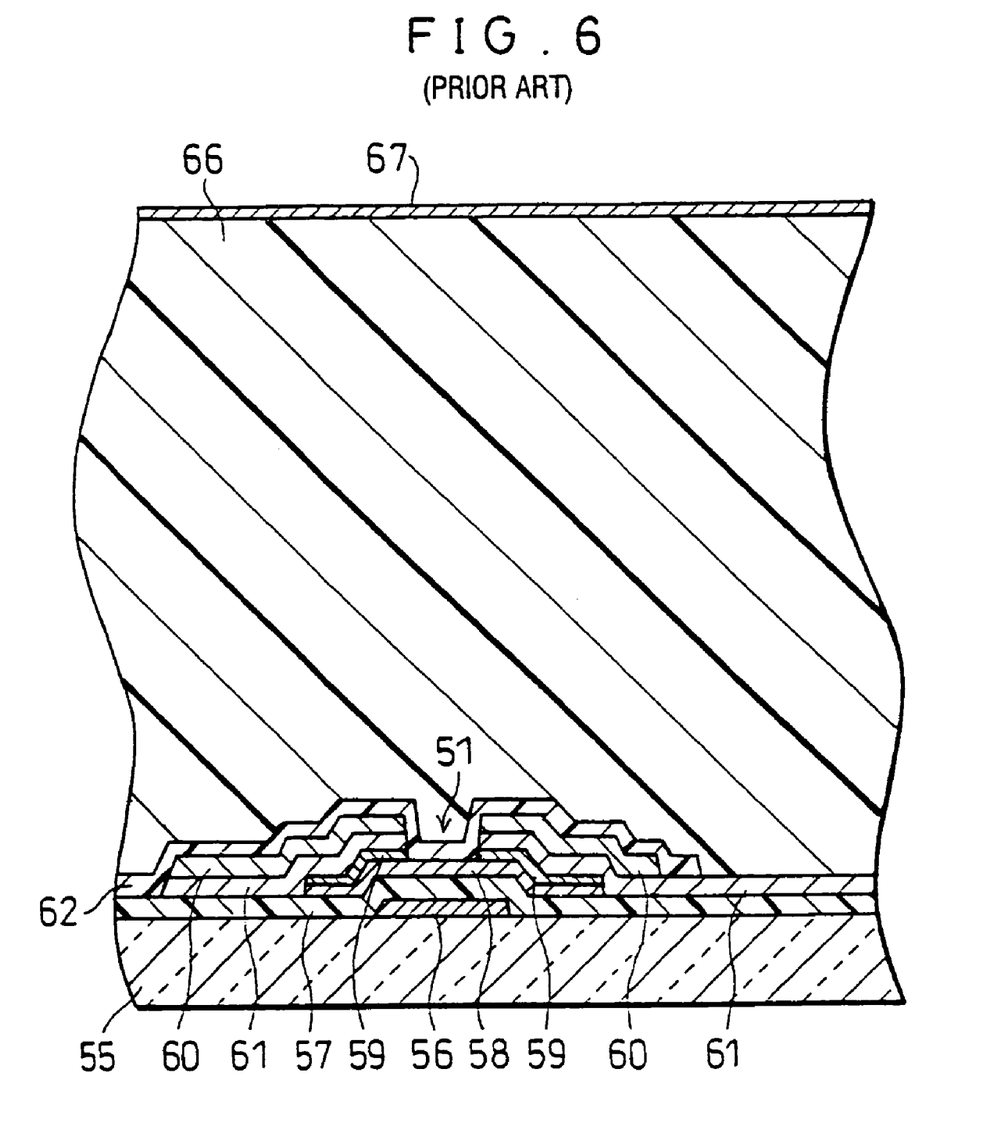
FIG. 6 is a cross sectional view of a conventional image sensor adopting an active matrix substrate.

FIG. 6 is a cross-sectional view illustrating a schematic structure of a known example of the basic image sensor adopting an active matrix substrate. The structure illustrated in FIG. 6 is disclosed in AM-LCD' 99 "Real-time Imaging Flat Panel X-Ray Detector" by M. Ikeda, et al. As illustrated in FIG. 6, the active matrix substrate of this sensor is prepared by forming a switching element 51 on a transparent insulating substrate 55, and further vapor-depositing thereon a conversion layer 66 and a metal layer 67 in this order. The switching element 51 is prepared by forming on the transparent insulating substrate 55, a gate electrode 56, an auxiliary capacitance electrode (not shown), a gate insulating film 57, a semiconductor layer 58, an n$^+$-Si layer 59 to be patterned into a drain electrode, a metal layer 60 and a transparent electrically conductive film 61 to be patterned into a source signal line, and a protective film 62 in this order, thereby forming a substrate of the image sensor. The conversion layer 66 is provided for converting an X-ray into electric charge. The metal layer 67 is patterned into an electrode for use in applying a voltage to the conversion layer 66. In the foregoing structure, the transparent electrically conductive film 61 is patterned into the pixel electrodes for storing the electric charge as converted in the conversion layer 66.

In the image sensor, the electric charge is read out from respective pixel electrodes in contrast to the liquid crystal display device in which electric charge is applied to the pixel electrodes. Therefore, if a normal readout operation of a predetermined cycle is not performed due to any failure, or a trouble in signal readout program, unexpectedly large electric charge may be stored in the pixel electrode, and the resulting high voltage may cause a damage on the active matrix substrate. The foregoing problem is discussed in "Characteristics of dual-gate thin film transistors for applications in digital radiology" (NRC'96) in "Can. I. Phys. (Suppl)74 published in 1996, in which the following structure has been proposed as a solution to the problem. That is, a pixel electrode is extended over a switching element, so that the pixel electrode can be functioned as one of the gate electrodes of a dual-gate transistor, and at or above a predetermined threshold voltage, the transistor is switched on, and excessive electric charge is released.

Figure 7:
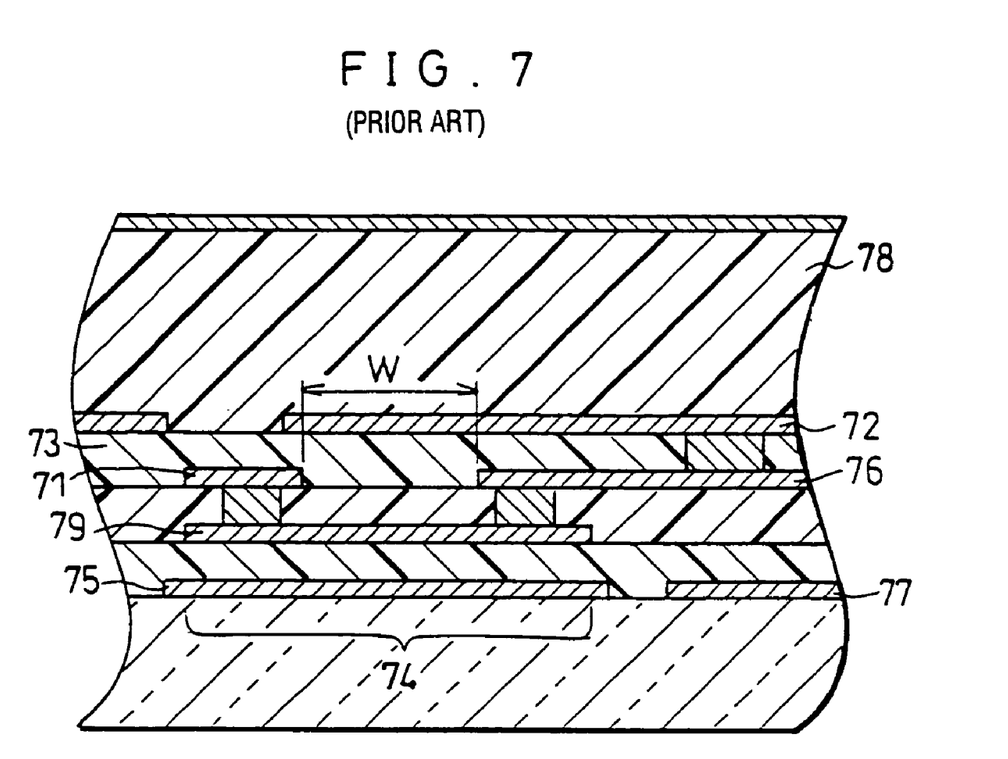
FIG. 7 is a cross sectional view illustrating the schematic structure of another conventional image sensor.

The structure of an image sensor which is particularly effective in preventing the foregoing problem will be explained in reference to FIG. 7. As illustrated in FIG. 7, the image sensor has a so-called "mushroom structure" wherein pixel electrodes 72 and source lines 71 are formed in different layers so as to be insulated by an insulating layer 73 formed in between, so that the entire channel region W of a transistor 74 is covered with the corresponding pixel electrode 72. In FIG. 7, the reference numerals 75, 76, 77, 78 and 79 indicate a gate electrode, a drain electrode, an auxiliary capacitance, a conversion layer and a semiconductor layer respectively.

The foregoing structure of Waechter, et al, illustrated in FIG. 7 is effective for the high voltage protection in the pixel electrodes 72. As to the size of the pixel electrodes 72, however, significant improvement from the aforementioned active matrix substrate illustrated in FIG. 6 cannot be expected. It is generally known that the larger is the area occupied by the pixel electrodes 72, the more efficiently, the electric charge generated from the conversion layer 78 can be collected in the pixel electrodes 72. In the generally used active matrix substrate, however, there is a limit for an increase in size of each pixel electrode as pixel electrodes are arranged in a plane with certain intervals from source bus lines.

In the foregoing structure of FIG. 7 wherein the insulating film 73 is formed between the source line 71 and the pixel electrodes 72, the pixel electrodes 72 can be formed over the source lines 71 while maintaining the insulation between them. In this state, the electrostatic capacitance is generated between the pixel electrodes 72 and the source lines 71, and an overall capacitance of the source lines 71 when seen from the side of the signal readout circuit increases, and a noise of the readout signal is increased, resulting in lower signal to noise (S/N) ratio. For the foregoing reasons, the structure of FIG. 7 would not offer any significant improvement in size of the pixel electrodes 72 from the conventional active matrix substrate.

In the X-ray image sensor, generally a large pixel capacitance is ensured. For this reason, the capacitance between the pixel electrode 72 and the source line 71 becomes a load capacitance to the source line 71 directly. On the other hand, internal noise generated in the signal readout amplifier is amplified by a gain in proportion to the ratio of the capacitance of the source line 71 to the feedback capacitance. It is therefore effective to reduce the capacitance of the source line 71 for a reduction in internal noise.

Further, an increase in capacitance of the source line 71 may cause variations in potential of the source line 71 corresponding to the capacitance CsD (per pixel) between the pixel electrode 72 and the source line 71 with changes in pixel potential corresponding to the part of the image irradiated with an X-ray. For example, when reading out signals via the source line 71 with a selection of certain scanning line, the electric charge is kept being stored in other pixel electrodes, while the electric charge in positive polarity and in proportion to the capacitance CsD are being stored in the source line 71. The amount of the electric charge to be stored in the pixel electrodes and the source line 71 differ depending on the image on an entire screen, thereby presenting a problem that a so-called crosstalk is generated when reading out signals as being affected by pixel electrodes aligned in direction parallel to the source line 71.

In order to reduce the capacitance of the source line 71, for example, an image sensor adopting an interlayer insulating film made of photosensitive resin has been proposed, for example, in "Similarities between TFT Arrays for Direct-Conversion X-Ray Sensors and High-Aperture AMLCDs" (SID 98 DIGEST) by W.den Boer, et al, published in 1998.

However, W.den Boer, et al does not refer to the dual-gate structure.

SUMMARY OF THE INVENTION

It is an object of the present invention to provide an image sensor of a dual-gate structure which permits excessive electric charge to be released effectively while suppressing an increase in capacitance between a pixel electrode and a signal line.

In order to achieve the above object, an image sensor of the present invention is characterized by including:

a conversion section for converting an incident electromagnetic wave into electric charge;

pixel electrodes for storing the electric charge generated by the conversion section;

switching elements for controlling reading out of the electric charge from the pixel electrodes;

an interlayer insulating film made of an organic film formed under each pixel electrode;

an electrically conductive film which is electrically connected to the pixel electrodes, and which is extended from the pixel electrode to a layer above each switching element; and a dielectric layer formed between the switching element and the electrically conductive film.

According to the foregoing structure, an interlayer insulating film is formed between the scanning lines, signal lines, and pixel electrodes in the active matrix substrate. It is therefore possible to form the pixel electrodes over the signal lines. As a result, an improved aperture ratio can be achieved, and in the meantime, by shielding the conversion layer from the electric field generated by the signal lines and the scanning lines, an operation inferior of the conversion layer becomes less likely to occur.

Moreover, the organic film of low dielectric constant can be formed thick with ease, and therefore the electrostatic capacitance between the pixel electrode and the source signal line can be suppressed to be small. As a result, an increase in noise due to an increase in capacitance of the source signal lines can be prevented, and an improved signal to noise (S/N) ratio can be achieved. Furthermore, the active matrix substrate of the image sensor can be manufactured by the manufacturing process of conventional liquid crystal display device without significant modification, and therefore any additional facility is not needed.

Furthermore, the electrically conductive film is extended from the pixel electrode over the switching element. Therefore, even if a normal readout operation of a predetermined cycle is not performed due to any failure, or trouble in signal readout program, and unexpectedly large electric charge is stored in the pixel electrode, the switching element is switched ON at or above a predetermined threshold voltage to release the excessive electric charge, thereby preventing the switching element from being damaged.

Moreover, by forming the dielectric layer between the switching element and the electrically conductive film, such characteristic that the thin film transistor is switched ON at or above a predetermined threshold voltage is determined by the thickness and the dielectric constant of the dielectric layer formed between the electrically conductive film and the switching element, and therefore, the foregoing characteristic can be set independently of the interlayer insulating film. Namely, while maintaining optimal excessive voltage discharge characteristic, the electrostatic capacitance between the pixel electrode and the source signal line can be suppressed, and in the meantime, the signal to noise (S/N) ratio can be improved.

In the foregoing structure, it may be arranged such that in an area above each switching element, the electrically conductive film contacts the dielectric layer without having the interlayer insulating film in between.

In the foregoing structure, it may be arranged such that the switching element is a dual-gate transistor, and the electrically conductive film functions as one of gate electrodes of the dual-gate transistor.

In the foregoing structure, it may be arranged such that each switching element including its channel region is covered with the dielectric layer, the electrically conductive film is extended from the pixel electrode to an area above the switching element including its channel region, and in an area above each switching element, the electrically conductive film contacts the dielectric layer without having the interlayer insulating film in between.

In the foregoing structure, it may be arranged such that the electric charge stored in the pixel electrode is a positive charge, and the switching element conducts with an application of a positive bias voltage.

Alternatively, it may be arranged such that the electric charge stored in the pixel electrodes is negative charge, and the switching element conducts with an application of a negative bias voltage.

In the foregoing structure, it may be arranged such that in an area above the switching element, the interlayer insulating film is formed between the dielectric layer and the electrically conductive film.

According to the foregoing structure, in the area above the switching element, which has the roughest surface in the active matrix substrate, formed are not only the dielectric layer but also the interlayer insulating film made of an organic film. With this structure, even such protrusions and recessions of the rough surface, which cannot be absorbed completely by the dielectric layer alone, can be absorbed to a sufficient level. In this structure, even when adopting a conversion layer made of selenium, it is still possible to suppress crystallization due to the protrusions and recessions, and therefore films can be formed under stable conditions.

In the foregoing structure, the interlayer insulating film may be structured such that at least a portion above the switching element is formed thinner than other portion of the interlayer insulating film.

In the foregoing structure, the excessive voltage discharge characteristic is determined by the thickness and the dielectric constant of the interlayer insulating film in the portion between the electrically conductive film extended from the pixel electrode and the switching element. It is therefore possible to set the foregoing characteristic independently of the interlayer insulating film in the portion for use in forming the electrostatic capacitance between the pixel electrode and the source electrode. Namely, with the foregoing structure, an improved S/N ratio can be achieved while maintaining optimal excessive voltage discharge characteristic.

In the foregoing structure, the interlayer insulating film may be structured such that at least a portion corresponding to the channel region of the switching element is formed thinner than other portion of the interlayer insulating film.

In the foregoing structure, a photosensitive organic film may be adopted as the interlayer insulating film.

According to the foregoing structure, in the area above the switching element, which has the roughest surface in the active matrix substrate, formed are not only the dielectric layer but also the interlayer insulating film made of the organic film. With this structure, even such protrusions and recessions of the rough surface, which cannot be absorbed completely by 0the dielectric layer alone, can be absorbed to a sufficient level. In this structure, even when adopting a conversion layer made of selenium, it is still possible to suppress crystallization due to the protrusions and recessions, and therefore films can be formed under stable conditions.

In order to achieve the foregoing object, another image sensor for converting incident electromagnetic wave into electric charge by each of a plurality of pixel electrodes and outputting image signals by sequentially reading out the electric charge from the pixel electrodes via switching elements, is characterized by including:

an electrically conductive film formed so as to be extended from the pixel electrode to a portion above each switching element; and an interlayer insulating film made of an organic film, formed below each pixel electrode and the electrically conductive film, the interlayer insulating film being structured such that a portion above the switching element is thinner than other portion of the interlayer insulating film.

In the foregoing structure, the excessive voltage discharge characteristic is determined by the thickness of the dielectric constant of the portion between the electrically conductive film extended from the pixel electrode and the switching element, and therefore, it is possible to set the foregoing characteristic independently of the interlayer insulating film in the portion for use in forming the electrostatic capacitance between the pixel electrode and the source electrode. Namely, with the foregoing structure, an improved S/N ratio can be achieved while maintaining optimal excessive voltage discharge characteristic.

In the foregoing structure, it may be arranged such that the interlayer insulating film is structured such that at least a portion corresponding to the channel region of the switching element is formed thinner than other portion of the interlayer insulating film.

In the foregoing structure, it may be arranged such that the channel region of the switching element contacts the interlayer insulating film.

In the foregoing structure, an inorganic film may be adopted for the dielectric layer.

In the foregoing structure, it may be arranged such that:

a double layer structure of the dielectric film of an inorganic film and the interlayer insulating film of an organic film is formed under the pixel electrode, in an area above each switching element, the electrically conductive film contacts the dielectric layer without having the interlayer insulating film in between.

In the foregoing structure, it may be arranged so as to further include:

a signal line for transferring charge as collected in each pixel electrode via a switching element, wherein the pixel electrode is formed over the signal line having the interlayer insulating film in between.

In order to achieve the above object, a method of manufacturing an image sensor of the present invention is characterized by including the steps of:

forming a plurality of switching elements, a plurality of scanning lines and a plurality of signal lines on an insulating substrate;

forming an interlayer insulating film made of a photosensitive organic film in respective portions above the plurality of switching elements, scanning lines and signal lines, exposing and developing a resulting photosensitive organic film;

forming pixel electrodes on the interlayer insulating film; and forming conversion means on the pixel electrodes for converting an incident electromagnetic wave into electric charge, wherein exposure with respect to the photosensitive organic film is varied between at least a portion of an area above each switching element and other portion of the photosensitive organic film.

According to the foregoing structure, the protrusions and recessions resulting from the patterning of the wires in layer below the interlayer insulating film can be suppressed by the interlayer insulating film, and an inferior in characteristics of the conversion means for converting an incident X-ray into electric change in upper layer can be prevented. Moreover, by adopting photosensitive resin, a smooth cross section can be achieved even at the pattern edge of the interlayer insulating film, and therefore it is possible to more surely prevent an inferior characteristic of the conversion means. Furthermore, as the pixel electrodes can be formed over the source electrodes, an area occupied by the pixel electrodes can be increased, and therefore, it is possible to collect the electric charge generated from the conversion means in an efficient manner. In the foregoing structure, even if a normal readout operation of a predetermined cycle is not performed due to any failure, or trouble in signal readout program, and unexpectedly large electric charge is stored in the pixel electrode, the switching element is switched ON at or above a predetermined threshold voltage to release the excessive electric charge, thereby preventing the switching element from being damaged. Moreover, while maintaining optimal excessive voltage discharge characteristics, the electrostatic capacitance between the pixel electrode and the source signal line can be suppressed, and in the meantime, the signal to noise (S/N) ratio can be improved.

For a fuller understanding of the nature and advantages of the invention, reference should be made to the ensuing detailed description taken in conjunction with the accompanying drawings.

DESCRIPTION OF THE EMBODIMENTS

To begin with, an image sensor in which pixel electrodes can be formed over source signal lines will be explained.

Figure 8:
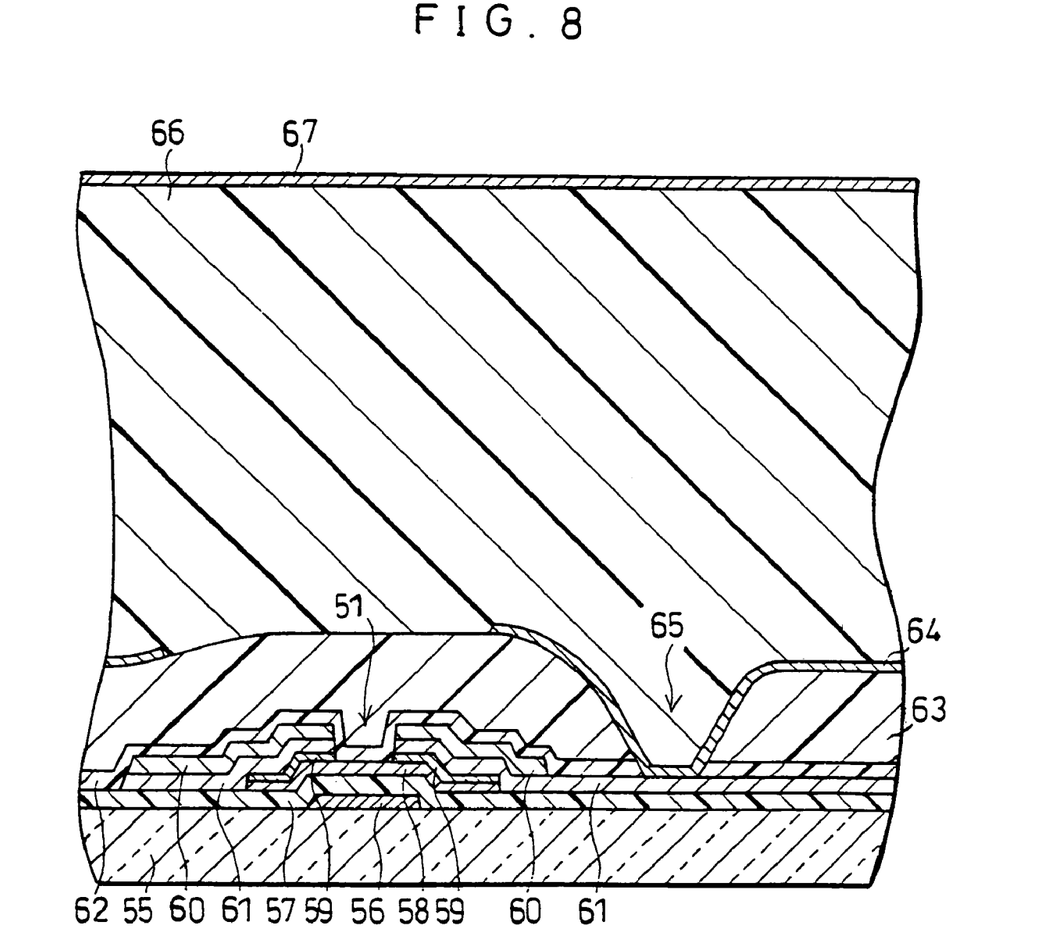
FIG. 8 is a cross sectional view illustrating the schematic structure of an image sensor.

The structure of the foregoing image sensor is illustrated in FIG. 8. In FIG. 8, members having the same functions as those illustrated in FIG. 6 will be given the same reference symbols.

In this image sensor, when forming a protective film 62 on a transparent conductive film 61, the portion corresponding to a contact hole 65 of the protective film 62 is removed by etching, and then photosensitive resin is applied by the spin coating method to form an interlayer insulating film 63. Thereafter, a contact hole 65 is formed by the normal photographic process, and a pixel electrode 64 formed on the interlayer insulating film 63 is connected to the drain electrode of the switching element 51 via the contact hole 65.

In the active matrix substrate manufactured in the foregoing method, wherein the interlayer insulating film 63 is formed between the scanning lines and signal lines, it is therefore possible to form the pixel electrode 64 over the signal line. With the foregoing structure, an improved aperture ratio can be achieved. Further, by shielding the conversion layer 66 from the electric field generated by the signal lines and the scanning lines, an operation inferior of the conversion layer 66 can be suppressed.

Although the pixel electrode 64 is formed over the source signal line, by adopting the interlayer insulating film 63 of a sufficient thickness with low dielectric constant, an increase in capacitance and a reduction in S/N can be prevented. Moreover, a slighter greater amount of signals collected that of the image sensor adopting the active matrix substrate illustrated in FIG. 6.

Figure 9:
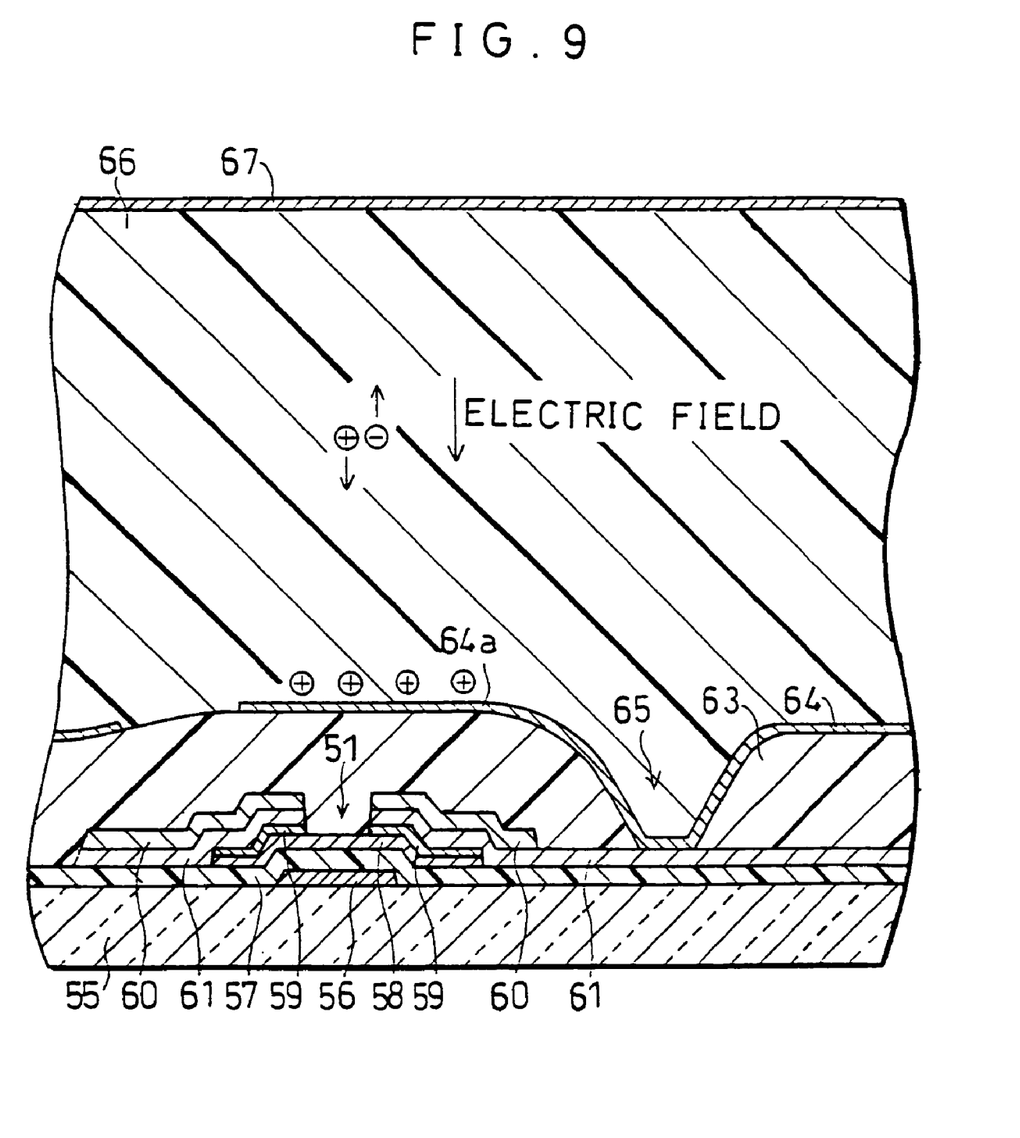
FIG. 9 is a cross sectional view illustrating the schematic structure of another image sensor.

Furthermore, by adopting the dual-gate structure in the foregoing structure of FIG. 8, an image sensor illustrated in FIG. 9 can be achieved. In FIG. 9, members having the same functions as those illustrated in FIG. 8 will be given the same reference symbols. In the image sensor of FIG. 9, a transparent electrically conductive film 64a extended from the pixel electrode 64 is formed via the interlayer insulating film 63. Here, the structure in which the protective film 62 is removed in an area above the switching element 51 will be considered.

As described, when a normal operation is not performed in an event of a trouble or an error in signal readout program, electric charge in positive polarity is kept being applied onto the pixel electrode 64 as illustrated in FIG. 9. In the previous structure of FIG. 8, a voltage may be increased to the level at which the switching element 51 is destroyed. In contrast, according to the structure illustrated in FIG. 9 adopting the double gate structure, when a pixel potential is raised to a predetermined threshold voltage, the extended transparent electrically conductive film 64a functions as one of the dual-gate electrodes, and the switching element 51 conducts at low conductivity, and excessive electric charge is released to the source signal line.

In the conventional excessive electric charge protection structure such as the mushroom structure illustrated in FIG. 7, silicon nitride or silicon oxide is deposited between the top gate 72 and the semiconductor layer 79 as in the typical active matrix substrate. As silicon nitride or silicon oxide has a high dielectric constant, due to restrictions in processing or film formation time, it is not possible to deposit such film made of silicon nitride or silicon oxide as thick as a film made of resin formed by the spin coating method. Therefore, in the resulting structure, it is likely that electric charges is released at relatively low potential. It is therefore not possible to store a large amount of electric charge, resulting in lower S/N. In view of a storage amount of electric charge, the aforementioned structure of FIG. 9 is advantageous over the foregoing structure of FIG. 7. As is clear from the foregoing explanations, the interlayer insulating film 63 desirably has low dielectric constant and is thick. However, when adopting such interlayer insulating film 63, a problem arises in that the conductivity of the switching element 51 by the top gate of the dual-gate becomes too low. Namely, the structure of FIG. 9 adopting the dual-gate structure may be effective for increasing the capacitance between the pixel electrode 64 and the source signal line depending on the property of the interlayer insulating film adopted, however, the function of releasing the excessive electric charge which is the advantageous characteristic of the dual-gate structure cannot be fully appreciated.

Depending on the amount of electric charge generated from the conversion layer 66 and the pixel capacitance, only a small amount of electric charge may be stored in the pixel electrodes 64. However, in this case, even if the electric charge starts being released by the top gate before the voltage is raised above a threshold high voltage, this would not be a problem. In the case of dealing with very small amount of electric charge like the case of the image sensor, variations among pixels of the switching elements 51 cause a serial problem, and therefore it is rather preferable to adopt such structure that the electric charge is released at potential slightly higher than the threshold potential.

Namely, when an unexpectedly high voltage of around several tens V is applied to the switching element 51 which is unlikely to generate in the normal operation, even once, a trap potential may be formed in the gate insulating film 57 or abnormality in characteristic occurs due to the electric charge being captured. The foregoing abnormality in characteristic possibly occurs even at relatively low voltage. For example, when for some reason, a scanning is stopped in the middle of the operation while maintaining signal charge in the pixels, such abnormality in characteristic possibly occurs even at low voltage with an application of a DC voltage over a long time. Especially, for the image sensor which deals with signals of very low level, deviations in the characteristic from the normal value would directly cause deviations in amount of charge of the signal to be collected. Therefore, the structure for preventing abnormality in characteristic is needed.

However, in the foregoing structure of FIG. 9, the switching element 51 conducts only at voltage of sufficiently high level, and the electric charge cannot be released at voltage slightly higher than the threshold voltage.

In view of the foregoing, an image sensor of a dual-gate structure which permits excessive electric charge to be released effectively while suppressing an increase in capacitance between a pixel electrode and a signal line will be explained in the following first embodiment of the present invention.

First Embodiment

Figure 1:
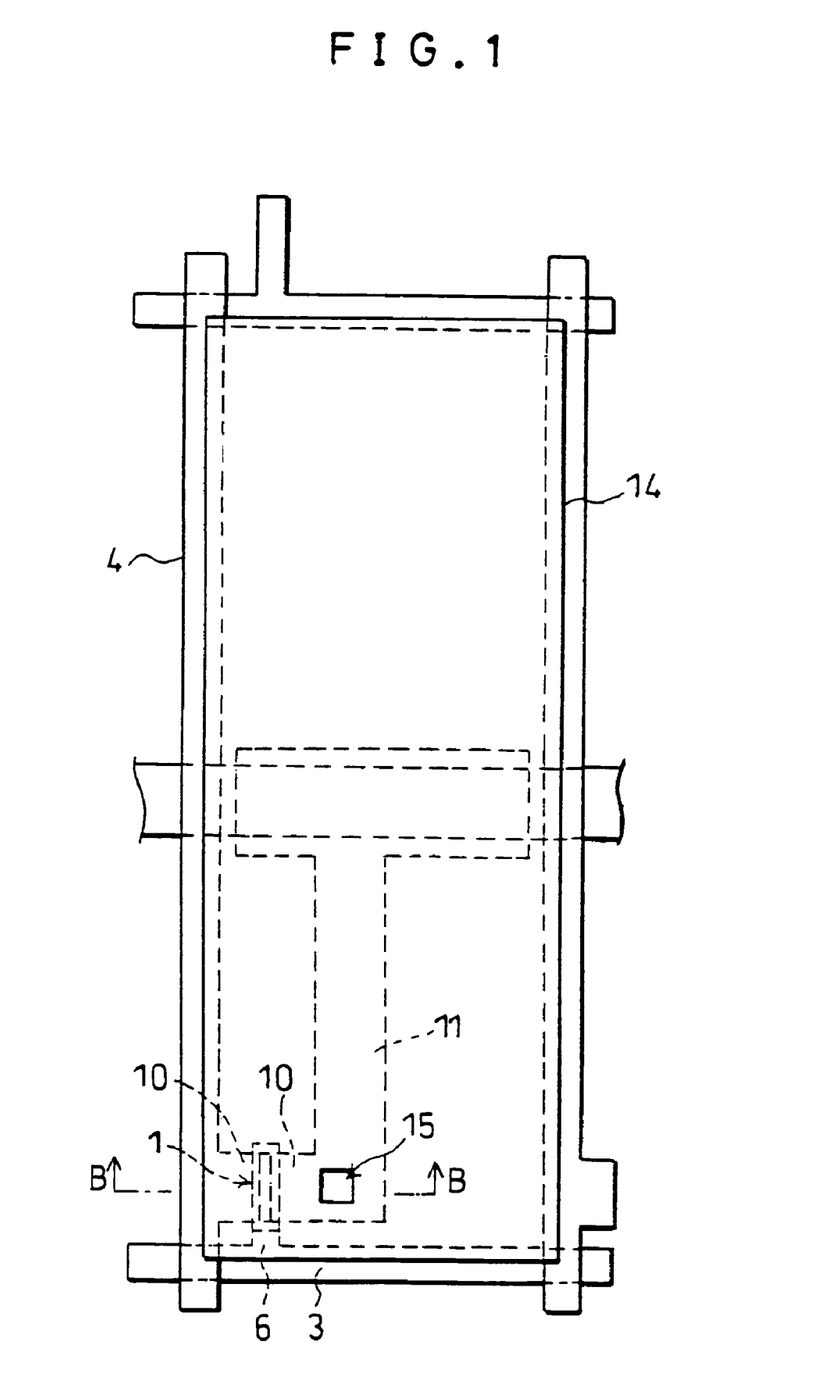
FIG. 1 is a front view illustrating an image sensor in accordance with one embodiment of the present invention.
Figure 2:
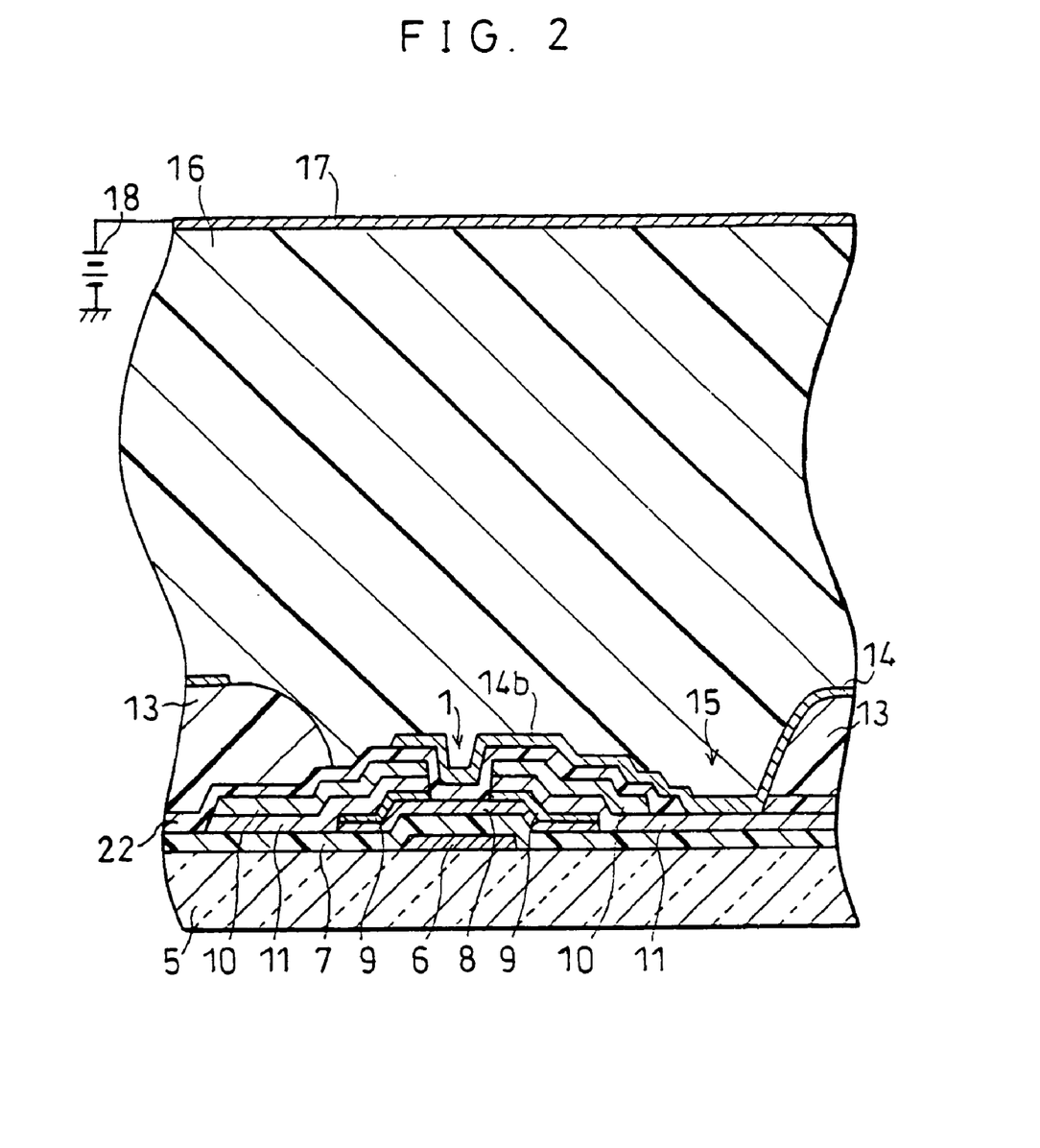
FIG. 2 illustrates a cross section of the portion along an arrow line B—B of the image sensor of FIG. 1.

The following descriptions will discuss one embodiment of the present invention in reference to FIG. 1 and FIG. 2.

FIG. 1 is a front view of an image sensor in accordance with one embodiment of the present invention. FIG. 2 is a cross section of the portion along an arrow line B—B in FIG. 1. The image sensor of the present embodiment includes a transparent insulating substrate 5, having formed thereon a scanning line 3, and a gate electrode 6 and an auxiliary capacitance line of a switching element 1. Further laminated thereon are a gate insulating film 7, a semiconductor layer 8, and an $n^+$-Si layer 9 to be patterned into a source electrode and a drain electrode. Then, the foregoing laminated structure is subjected to patterning. On the $n^+$-Si layer 9, further laminated are a transparent conductive layer 11 and a metal layer 10 for use in a source signal line 4, and the resulting laminated structure is subjected to the patterning.

The wires and the patterns have a double layer structure as in the foregoing, for purpose of purpose of suppressing problem associated with a disconnection of a wire due to dust particles accumulated on a layer and preventing the base layer from being damaged during the patterning of the overlying metal layer.

Then, a dielectric layer 22 is formed, and the portion corresponding to the contract hole 15 is removed by etching. Thereafter, photosensitive acrylic transparent resin is applied by the spin coating method, thereby forming an inter-layer insulating film 13. For this resin, for example, positive type photosensitive resin may be adopted. The resin has a dielectric constant of 3, and a thickness of 2 µm. Then, as in the normal photographic process, the developing is performed by exposing the area above the switching element 1 and the portion corresponding to the contact hole 15. As described, after forming an interlayer insulating film 13, a transparent conductive layer to be patterned into pixel electrodes 14 is formed, and is subjected to the patterning by etching. Here, the pixel electrode 14 is connected to the drain electrode of the switching element 1 via the contact hole 15 through the dielectric layer 22 and the interlayer insulating film 13.

The essential feature of the image sensor of the present embodiment lies in that in an area above the switching element 1, the transparent dielectric layer 14b extended from the pixel electrode 14 is formed via the dielectric layer 22. The dielectric layer 22 is adopted also in the conventional active matrix substrate as a protective film for the purpose of improving the reliability of the switching element 1. For this dielectric layer 22, silicon nitride or silicon oxide is typically used. The dielectric film 22 is formed in thickness of several thousands A. In the area above the switching element 1, the interlayer insulating film 13 is removed by exposure and development, wherein the transparent dielectric layer 14b extended from the pixel electrode 14 contacts the protective film 22.

In the image sensor of the present embodiment, a double layer structure of the dielectric film 22 of an inorganic film and the interlayer insulating film 13 of an organic film is formed under the pixel electrode 14, and the interlayer insulating film 13 is eliminated only from the area above the switching element 1.

On the upper layer of the foregoing active matrix substrate, a conversion layer 16 made of selenium is vapor-deposited, for example, by the vacuum deposition. On the conversion layer 16, deposited is a gold layer 17 to be patterned into an electrode for applying a voltage to the conversion layer 16, thereby forming a substrate of the image sensor. In this example, the conversion layer, a positive bias voltage is applied by a power source 18.

According to the foregoing active matrix substrate, the interlayer insulating film 13 is formed between the scanning lines 3, the scanning lines 4, and the pixel electrodes 14, and it is therefore possible to form the-pixel electrodes 14 over the signal lines 4. With the forgoing characteristic structure, the aperture ratio can be improved, and at the same time, operation inferior of the conversion layer 16 can be suppressed by shielding it from the electric field generated by the signal lines 4 and the scanning lines 3. By adopting the interlayer insulating film 13 of a sufficient thickness and of low dielectric constant, an increase in capacitance and a reduction in S/N ratio can be suppressed even in the foregoing structure of forming the pixel electrodes 14 over the source signal lines 4.

In the area above the switching element 1, the transparent conductive layer 14b extended from the pixel electrode 14 is formed via the dielectric layer 22. With this structure, the transparent conductive layer 14a functions as a top gate of the dual-gate transistor, and the switching element 1 conducts at potential slightly higher than the threshold potential, thereby releasing excessive electric charge into the source signal line 4.

In the foregoing structure, when the electric change is released at a potential slightly higher than the threshold potential, the DC voltage of low level is applied to the switching element 1, and when a voltage of higher level is applied, the switching element 1 strongly conducts and can release the electric charge at extremely low time constant. Namely, as compared to the interlayer insulating film 63 of several µm, the dielectric layer 22 in the thickness of several hundreds of Å where the pixel electrode is closer to the gate insulating film 7 for use in the gate electrode 6 and the bottom gate of the dual gate is more suited for the above condition, and thus offers greater effects of preventing the foregoing problem of variations in characteristics among pixels.

The dielectric layer 22 is formed by the vapor deposition such as CVD (Chemical Vapor Deposition) method whose thickness can be adjusted in a simpler manner than the film thickness adjustment of the interlayer insulating film 63 (see FIG. 8) formed by the spin coating method. Moreover, the dielectric layer 22 made of silicon nitride or silicon oxide offers stable properties unlike the organic film. Therefore, changes in characteristics of the insulating film caused by the electric field in the operation of the optical sensor is less likely to occur. The foregoing advantageous characteristics are very important in preventing an increase in leak current due to variations in switching effects by the top gate being used or deteriorations in high voltage protection function.

In the foregoing preferred embodiment, explanations have been given through the case wherein positive electric charge is stored in the pixel electrode 14, and when excessive electric charge is stored in the pixel electrode 14, a positive bias voltage is applied to the switching element 1 to conduct it, to allow excessive electric charge to be released. However, the switching element of the present invention is not limited to the above, and for example, p-type channel transistor may be adopted. In this case, negative electric charge generated from the conversion layer 16 with an application of negative vias charge is stored in the pixel electrode 14, and when excessive electric charge is stored in the pixel electrode 14, negative bias voltage is applied to the switching element 1 to conduct it to allow excessive electric charge to be released. Needless to mention, the foregoing structure using a negative bias voltage offers the same effects as achieved from the foregoing structure of the above preferred embodiment.

Second Embodiment

Figure 3:
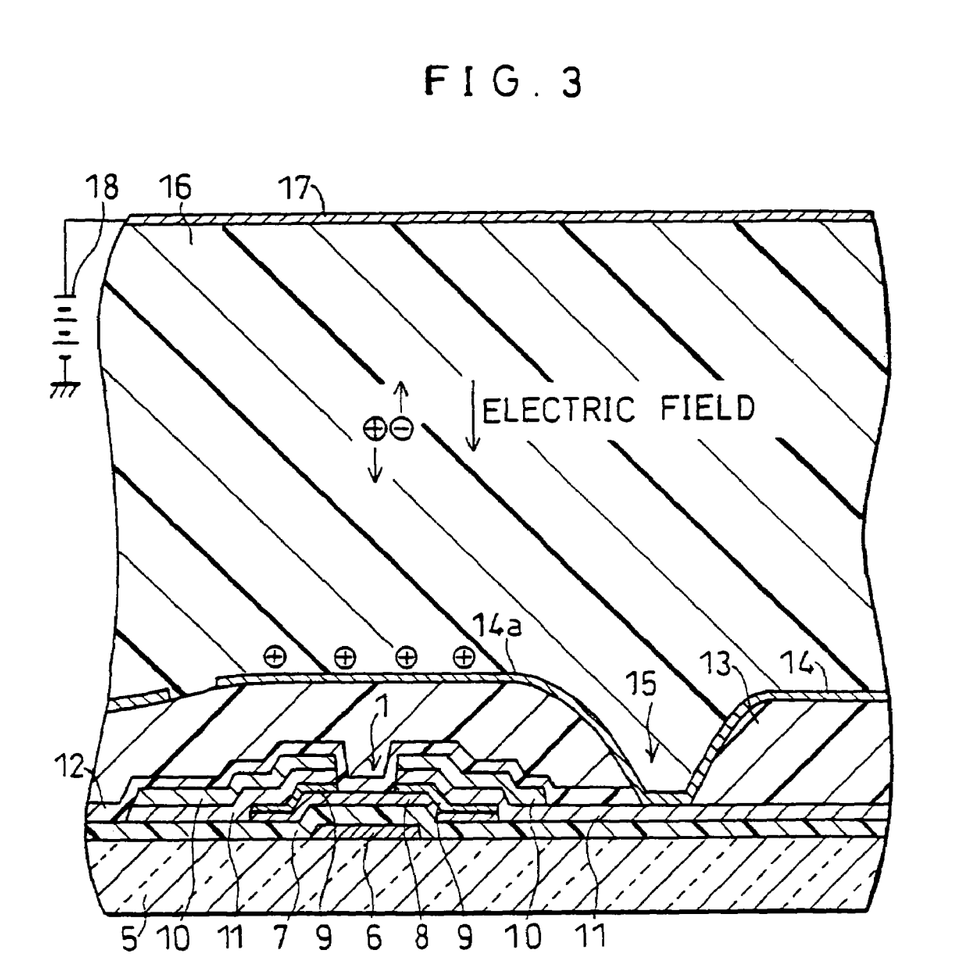
FIG. 3 is a cross sectional view of an image sensor in accordance with another embodiment of the present invention.

The following descriptions will discuss another embodiment of the present invention in reference to FIG. 3. For ease of explanation, members (structures) having the same functions as those shown in the drawings pertaining to the first embodiment above will be given the same reference symbols, and explanation thereof will be omitted here.

FIG. 3 is a cross sectional view of an image sensor in accordance with the second embodiment of the present invention. The image sensor of the present embodiment basically has the same structure as the image sensor of the first embodiment illustrated in FIG. 1 and FIG. 2 except for the following structure. In the image sensor of the present embodiment, in an area above the switching element 1, a transparent conductive layer 14a extended from the pixel electrode 14 is formed via not only a protective film 12 (dielectric layer) but also the interlayer insulating film 13. Namely, the image sensor of the present embodiment differs from the image sensor of the previous embodiment in that, the interlayer insulating film 13 and the transparent electrically conductive film 14a are formed on the protective film 12 in the channel region of the switching element 1.

The foregoing structure of the present embodiment offers the effect as achieved from the structure illustrated in FIG. 9 and the effect as achieved from the structure illustrated in FIG. 1 and FIG. 2, i.e., an improved reliability of the switching element 1, and prevention of a leak current due to a top gate at low voltage. Moreover, according to the structures illustrated in FIG. 1 and FIG. 2, in the area above the switching element, which has the roughest surface in the active matrix substrate contacts the conversion layer 16 only via the dielectric layer 22, and with the single use of this dielectric layer 22, the roughness may not be absorbed completely. In response, the image sensor of the present embodiment is structured so as to form the interlayer insulating film 13 and the transparent conductive layer 14a on the protective film 12 (dielectric layer) to make the surface smoother. With this structure, even when adopting the conversion layer 16 made of selenium which is liable to be crystallized by the protrusions and recessions of the rough surface, it is still possible to form films under stable conditions.

The thickness of the interlayer insulating film 13 may be selected such that optimal characteristics can be achieved when used in combination with the protective film 12. Specifically, first, the total amount of electrostatic capacitance is set such that i) the current-voltage condition in which the switching element 1 can be surely prevented from being destroyed against high voltage, and ii) the condition of preventing leak current in normal operations can be well-balanced, and the film thickness of the protective film 12 (inorganic film) and the film thickness of interlayer insulating film 13 (organic film) which prevents an inferior in the conversion layer 16 may be set so as to satisfy the total amount of electrostatic capacitance as set.

Third Embodiment

Figure 4:
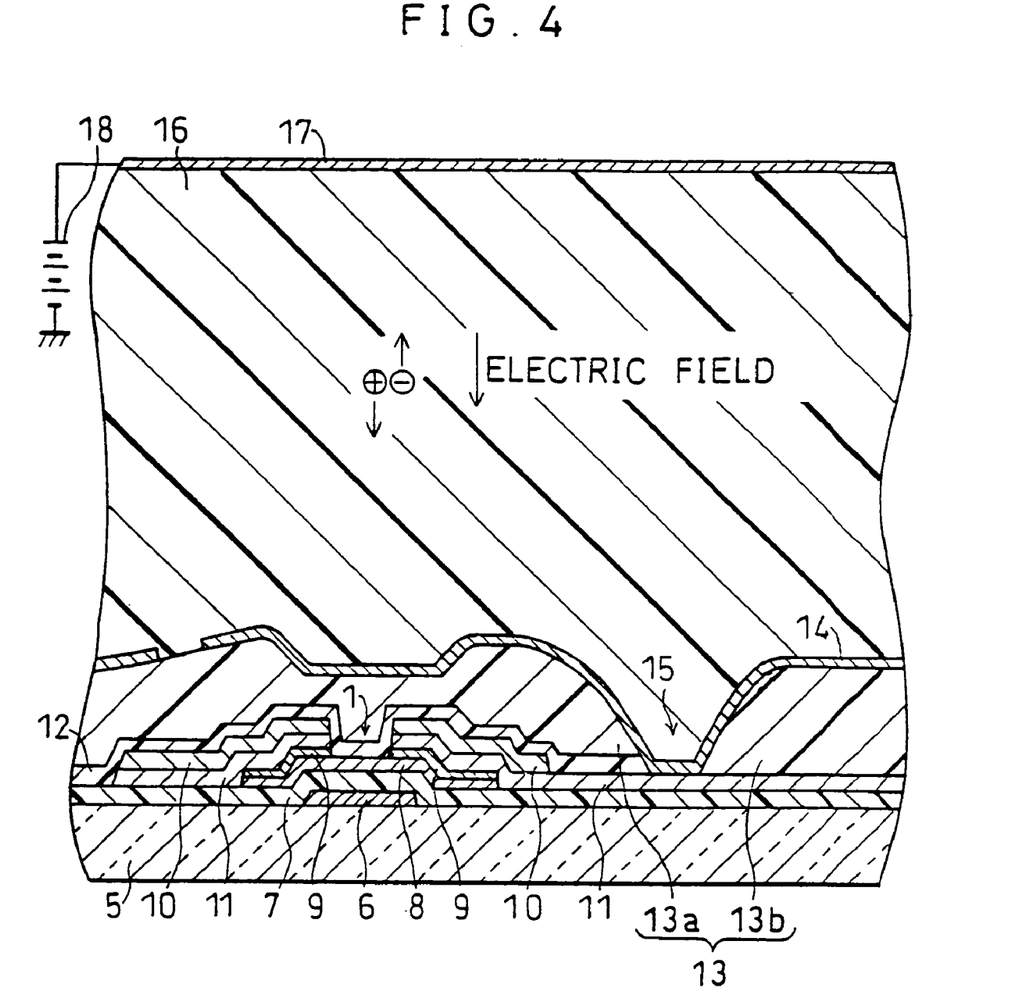
FIG. 4 is a cross sectional view of an image sensor in accordance with still another embodiment of the present invention.
Figure 5:
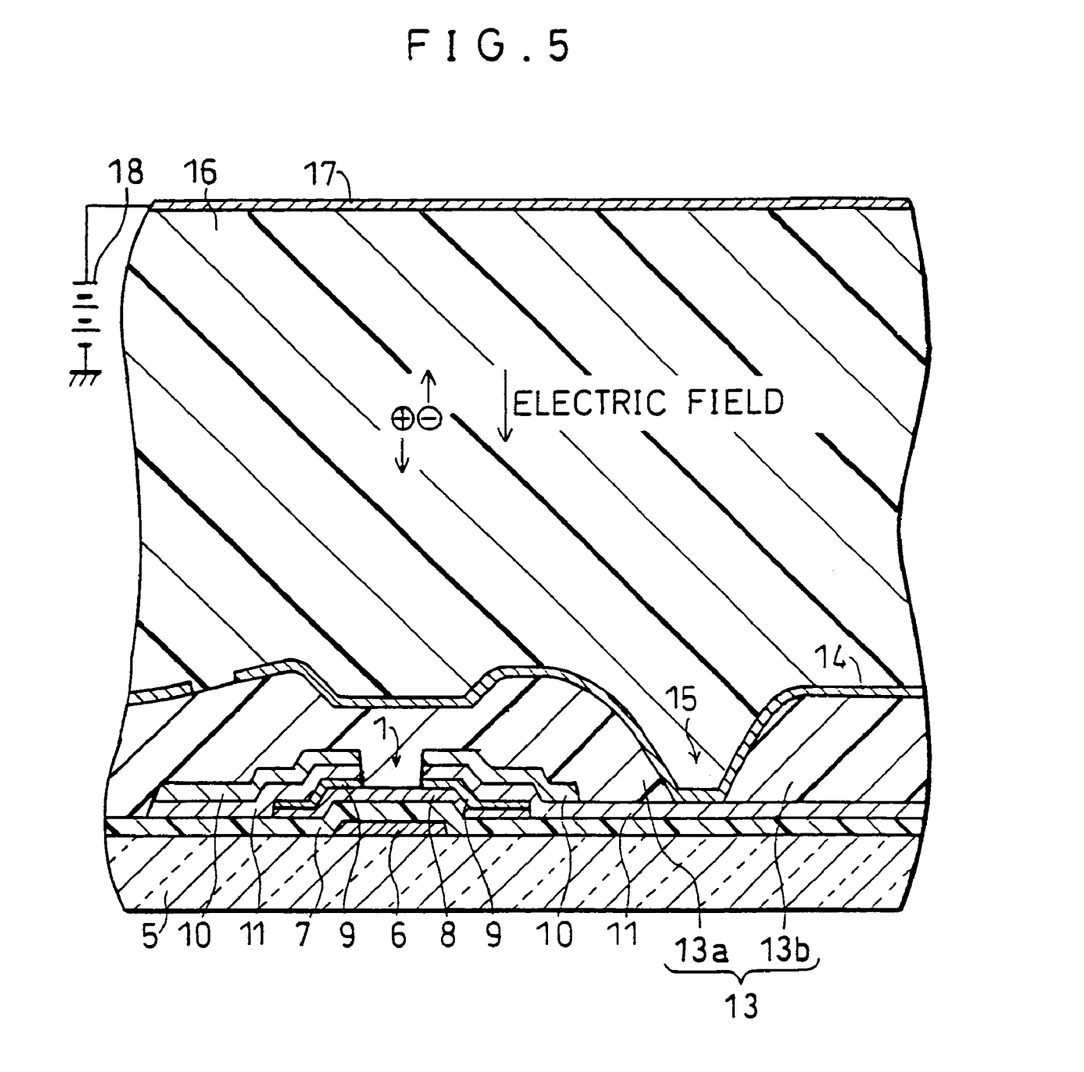
FIG. 5 is a cross sectional view of a modified example of the image sensor of FIG. 4 from which a dielectric layer is omitted.

The following descriptions will discuss still another embodiment of the present invention in reference to FIGS. 4 and 5. For ease of explanation, members (structures) having the same functions as those shown in the drawings pertaining to the first and second embodiments above will be given the same reference symbols, and explanation thereof will be omitted here.

FIG. 4 shows a cross sectional view of an image sensor in accordance with the third embodiment of the present invention. The image sensor of the present embodiment differs from the image sensor of the second embodiment illustrated in FIG. 3 in the following structure. That is, the interlayer insulating film 13 is constituted by an interlayer insulating film 13a formed in an area above the switching element 1, and an interlayer insulating film 13b of the remaining portion. The interlayer insulating film 13 is structured such that the interlayer insulating film 13a and the interlayer insulating film 13b have different thicknesses. Specifically, the thickness of the interlayer insulating film 13a is set such that the switching element 1 can be prevented from being destroyed against high voltage and in the meantime leak current in the normal operation can be prevented. On the other hand, the interlayer insulating film 13b of the remaining portion is formed thicker than the interlayer insulating film 13a, i.e., 2 μm so that a level difference at a portion where the source signal line 4 and a scanning signal line 3 crosses, and a reduction in capacitance between the pixel electrode 14 and the source signal line 4 can be surely suppressed.

By adopting the photosensitive organic film for the interlayer insulating film 13, the foregoing structure can be realized with ease by the following method. Firstly, the process up to the formation of the metal layer 10 and the transparent electrically conductive film 11 are performed by the known method of manufacturing a active matrix substrate. Then, the dielectric layer (protective film) 12 is formed, and the portion corresponding to the contact hole 15 of the dielectric layer 12 is removed by etching. Then, photosensitive acrylic transparent resin is applied to the thickness of 2 μm by the spin coating method. Further, after exposing on the switching element 1 with an ultraviolet ray of low intensity, or with an ultraviolet ray of normal intensity, the portion corresponding to the contact hole 15 is fully exposed. As the acrylic transparent resin is positive photosensitive resin, the exposed portion can be removed in the same developing process as that of the normal photographic process. On the other hand, the portion above the switching element 1 is not fully exposed, and therefore, the upper layer is not removed be removed completely by developing, and the residual layer on the switching element 1 is formed in an insulating thin film 13a.

In the foregoing manner, the active matrix substrate of the image sensor can be formed with ease only by switching exposure without increasing the number of steps in the manufacturing process. Specifically, after forming the interlayer insulating films 13a and 13b of different thicknesses, the transparent insulating layer for use in forming the pixel electrode 14 is formed, and is patterned by etching, thereby forming the active matrix part of the image sensor. With the forgoing method, both a) the portion from which the interlayer insulating film 13 is removed completely, and b) the-portion where the thin film portion 13a is formed thin have smooth cross sections, as in the characteristic of the photosensitive organic layer formed by developing in the photographic process, and therefore, the likelihood of the foregoing problem can be prevented.

According to the structure illustrated in FIG. 4, the double layer structure of the protective film 12 (dielectric layer) and the interlayer insulating film 13 are formed between the switching element 1 and the pixel electrode 14. However, according to the structure of adjusting the film thickness of the interlayer insulating film 13a cn the switching element 1, the discharge characteristic of an excessive voltage can be controlled by adjusting the film thickness of the interlayer insulating film 13. It is therefore possible to eliminate the dielectric film 22 provided that the reliability of the switching element 1 can be ensured. Without the dielectric layer 22, as illustrated in FIG. 5, the semiconductor layer 8 in the channel region of the switching element 1 is in direct contact with the interlayer insulating film 13a.

In the case where the organic film contacts the channel portion, due to dispersion of impurities from the interlayer insulating film 13a of an organic film into the semiconductor layer 8 in the channel region, or a trap level on the interface between the interlayer insulating film 13a and the semiconductor layer 8, it is possible that the abnormality in characteristics of the switching element 1 occurs, or the reliability of the switching element 1 may not be ensured. In that case, the structure of FIG. 4 should be adopted. On the other hand, in the case the desirable characteristic and reliability of the switching element 1 can be ensured, the structure as illustrated in FIG. 5 without the dielectric layer 22 may be adopted.

In the foregoing first through third preferred embodiments, the active matrix substrate, which is a precursor to the sensor in the foregoing example can be manufactured at low costs without requiring any additional facilities, because the manufacturing process for liquid crystal display devices can be used for the manufacturing process of image sensors only by adjusting the dimensions of the pixel capacitance and the time constants of the switching elements to be optimal for image sensors.

As described, an image sensor of the present invention for converting incident electromagnetic wave into electric charge by each of a plurality of pixel electrodes and sequentially reading the electric charge from the pixel electrodes via switching elements, so as to output image signals, is characterized by including:

an electrically conductive film formed so as to be extended from the pixel electrode to a layer above the switching element; and an interlayer insulating film made of an organic film, formed in a layer below each pixel electrode and the electrically conductive film, the interlayer insulating film being structured such that a portion above the switching element is thinner than the rest of the interlayer insulating film.

According to the foregoing structure, an interlayer insulating film is formed between the scanning lines, signal lines, and pixel electrodes in the active matrix substrate. It is therefore possible to form the pixel electrodes over the signal lines. As a result, an improved aperture ratio can be achieved, and in the meantime, by shielding the conversion layer from the electric field generated by the signal lines and the scanning lines, an operation inferior of the conversion layer becomes less likely to occur.

Moreover, the organic film of low dielectric constant can be formed thick with ease, and therefore the electrostatic capacitance between the pixel electrode and the source signal line can be suppressed to be small. As a result, an increase in noise due to an increase in capacitance of the source signal lines can be prevented, and an improved signal to noise (S/N) ratio can be achieved. Furthermore, the active matrix substrate of the image sensor can be manufactured by the manufacturing process of conventional liquid crystal display device without significant modification, and therefore any additional facility is not needed.

Furthermore, the electrically conductive film is extended from the pixel electrode over the switching element. Therefore, even if a normal readout operation of a predetermined cycle is not performed due to a trouble or an error in signal readout program, and unexpectedly large electric charge is stored in the pixel electrode, the switching element is switched ON at or above a predetermined threshold voltage to release the excessive electric charge, thereby preventing the switching element from being damaged.

Moreover, by forming the dielectric layer between the switching element and the electrically conductive film, such characteristic that the thin film transistor is switched ON at or above a predetermined threshold voltage is determined by the thickness and the dielectric constant of the dielectric layer formed between the electrically conductive film and the switching element, and therefore, the foregoing characteristic can be set independently of the interlayer insulating film. Namely, while maintaining optimal excessive voltage discharge characteristics, the electrostatic capacitance between the pixel electrode and the source signal line can be suppressed, and in the meantime, the signal to noise (S/N) ratio can be improved.

The foregoing image sensor of the present invention may be arranged such that in an area above the switching element, the interlayer insulating film is formed between the dielectric layer and the electrically conductive film.

According to the foregoing structure, in the area above the switching element, which has the roughest surface in the active matrix substrate, formed are not only the dielectric layer but also the interlayer insulating film made of the organic film. With this structure, even such protrusions and recessions of the rough surface, which cannot be absorbed completely by the dielectric layer alone, can be absorbed to a sufficient level. In this structure, even when adopting a conversion layer made of selenium, it is still possible to suppress crystallization due to the protrusions and recessions, and therefore films can be formed under stable conditions.

In the image sensor of the foregoing structure, the interlayer insulating film is structured such that at least a portion corresponding to the channel region of the switching element is formed thinner than other portion of the interlayer insulating film.

In the foregoing structure, the excessive voltage discharge characteristic is determined by the thickness and the dielectric constant of the interlayer insulating film in the portion between the electrically conductive film extended from the pixel electrode and the switching element. It is therefore possible to set the foregoing characteristic independently of the interlayer insulating film in the portion for use in forming the electrostatic capacitance between the pixel electrode and the source electrode. Namely, with the foregoing structure, an improved S/N ratio can be achieved while maintaining optimal excessive voltage discharge characteristic.

Another image sensor of the present invention for converting incident electromagnetic wave into electric charge by each of a plurality of pixel electrodes and outputting image signals by sequentially reading out the electric charge from the pixel electrodes via switching elements is characterized by including:

an electrically conductive film formed so as to be extended from the pixel electrode to a portion above each switching element; and an interlayer insulating film made of an organic film, formed below each pixel electrode, the interlayer insulating film being structured such that a portion above the switching element is thinner than other portion of the interlayer insulating film.

In the foregoing structure, the excessive voltage discharge characteristic is determined by the thickness of the dielectric constant of the portion between the electrically conductive film extended from the pixel electrode and the switching element, and therefore, it is possible to set the foregoing characteristic independently of the interlayer insulating film in the portion for use in forming the electrostatic capacitance between the pixel electrode and the source electrode. Namely, with the foregoing structure, an improved S/N ratio can be achieved while maintaining optimal excessive voltage discharge characteristic.

The foregoing image sensor of the present invention may be characterized in that the interlayer insulating film is made of a photosensitive organic film.

According to the foregoing structure, in the area above the switching element, which has the roughest surface in the active matrix substrate, formed are not only the dielectric layer but also the interlayer insulating film made of the organic film. With this structure, even such protrusions and recessions of the rough surface, which cannot be absorbed completely by the dielectric layer alone, can be absorbed to a sufficient level. In this structure, even when adopting a conversion layer made of selenium, it is still possible to suppress crystallization due to the protrusions and recessions, and therefore films can be formed under stable conditions.

The method of manufacturing an image sensor of the present invention is characterized by including the steps of:

forming a plurality of switching elements, a plurality of scanning lines and a plurality of signal lines on an insulating substrate;

forming an interlayer insulating film made of a photosensitive organic film in respective portions above the plurality of switching elements, scanning lines and signal lines, exposing and developing a resulting photosensitive organic film;

forming pixel electrodes on the interlayer insulating film; and forming conversion means on the pixel electrodes for converting an incident electromagnetic wave into electric charge, wherein exposure with respect to the photosensitive organic film is varied between at least a portion of an area above each switching element and other portion of the photosensitive organic film.

According to the foregoing structure, the protrusions and recessions resulting from the patterning of the wires in layer below the interlayer insulating film can be suppressed by the interlayer insulating film, and an inferior in characteristics of the conversion means for converting an incident X-ray into electric change on the upper layer can be prevented. Moreover, by adopting photosensitive resin, a smooth cross section can be achieved even at the pattern edge of the interlayer insulating film, and therefore it is possible to more surely prevent an inferior characteristic of the conversion means. Furthermore, as the pixel electrodes can be formed over the source electrodes, an area occupied by the pixel electrodes can be increased, and therefore, it is possible to collect the electric charge generated from the conversion means in an efficient manner. In the foregoing structure, even if a normal readout operation of a predetermined cycle is not performed due to a trouble or an error in signal readout program, and unexpectedly large electric charge is stored in the pixel electrode, the switching element is switched ON at or above a predetermined threshold voltage to release the excessive electric charge, thereby preventing the switching element from being damaged. Moreover, while maintaining optimal excessive voltage discharge characteristics, the electrostatic capacitance between the pixel electrode and the source signal line can be suppressed, and in the meantime, the signal to noise (S/N) ratio can be improved.

Furthermore, the interlayer insulating film of the portion determining the excessive voltage discharge characteristic of the switching element and the interlayer insulating film of the portion determining the electrostatic capacitance between the pixel electrode and the source signal line can be formed in thickness as desired by adjusting the exposure, thereby controlling respective physical values to be optimal values with ease without increasing the manufacturing steps.

Such variations are not to be regarded as a departure from the spirit and scope of the invention, and all such modification as would be obvious to one skilled in the art are intended to be included within the scope of the following claims.

What is claimed is:

1. An image sensor, which converts an incident electromagnetic wave into electric charge by a conversion section, and which reads out as a signal, the electric charge as collected in a pixel electrode, via a switching element, wherein said switching element is a thin film transistor wherein its drain electrode is connected to said pixel electrode, and its source electrode is connected to a signal line;

said image sensor, comprising:

an electrically conductive film which is extended from the pixel electrode to a layer above said switching element; and a dielectric film made of an inorganic film, said dielectric film being formed at least on a channel region of said switching element; and an interlayer insulating film made of an organic film, formed on an upper surface of said dielectric film and at a lower surface of said electrically conductive film and said pixel electrode, wherein a total amount of electrostatic capacitance of said interlayer insulating film and said dielectric film is selected so as to prevent said switching element from being destroyed against high voltage, and to prevent a leak current in normal operations; and a thickness of said dielectric film and a thickness of said interlayer insulating film are selected respectively to satisfy said total amount of electrostatic capacitance of said interlayer insulating film and said dielectric film.

2. The image sensor as set forth in claim 1, wherein said switching element is a dual-gate transistor, and said electrically conductive film functions as one gate electrode of said dual-gate transistor.

3. The image sensor as set forth in claim 1 wherein said conversion section is made of selenium.

4. The image sensor as set forth in claim 1, wherein the electric charge stored in said pixel electrode is a positive charge, and said switching element conducts with an application of a positive bias voltage.

5. An image sensor comprising:

a conversion section for converting an incident electromagnetic wave into electric charge;

pixel electrodes for storing the electric charge generated by said conversion section;

switching elements for controlling reading out of the electric charge from the pixel electrodes;

an interlayer insulating film made of an organic film formed immediately below a lower surface of said pixel electrodes;

an electrically conductive film which is electrically connected to said pixel electrode and which is extended from the pixel electrode to a layer above each switching element;

a dielectric layer formed between the switching element and said electrically conductive film;

wherein said switching element is a dual-gate transistor, and said electrically conductive film functions as one gate electrode of said dual-gate transistor;

wherein a total amount of electrostatic capacitance of said interlayer insulating film and said dielectric layer is selected so as to prevent said switching element from being destroyed against high voltage, and to prevent a leak current in normal operations; and a thickness of said dielectric layer and a thickness of said interlayer insulating film are selected respectively to satisfy said total amount of electrostatic capacitance of said interlayer insulating film and said dielectric layer.

6. The image sensor as set forth in claim 5, wherein said conversion section is made of selenium.

7. The image sensor as set forth in claim 5, wherein:

the electric charge stored in said pixel electrode is a positive charge, and said switching element conducts with an application of a positive bias voltage.

* * * * *